US009552255B2

(12) United States Patent
Kim et al.

(10) Patent No.: US 9,552,255 B2
(45) Date of Patent: Jan. 24, 2017

(54) MEMORY DEVICE WITH PARALLEL ODD AND EVEN COLUMN ACCESS AND METHODS THEREOF

(71) Applicant: SK hynix Inc., Gyeonggi-do (KR)

(72) Inventors: Kyung-Whan Kim, Gyeonggi-do (KR); Dong-Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/926,834

(22) Filed: Oct. 29, 2015

(65) Prior Publication Data

US 2016/0365131 A1 Dec. 15, 2016

(30) Foreign Application Priority Data

Jun. 9, 2015 (KR) ........................ 10-2015-0081145

(51) Int. Cl.
*G06F 11/10* (2006.01)
*G11C 7/10* (2006.01)
*G11C 7/22* (2006.01)
*G11C 8/18* (2006.01)

(52) U.S. Cl.
CPC ......... *G06F 11/1048* (2013.01); *G11C 7/1072* (2013.01); *G11C 7/22* (2013.01); *G11C 8/18* (2013.01)

(58) Field of Classification Search
CPC ...... G06F 11/1048; G11C 7/1072; G11C 7/22; G11C 8/18
See application file for complete search history.

(56) References Cited

U.S. PATENT DOCUMENTS

| 5,892,730 A * | 4/1999 | Sato ..................... G11C 7/1072 365/189.05 |
| 2003/0043682 A1* | 3/2003 | Usuki .................. G11C 7/1069 365/230.03 |
| 2006/0020739 A1* | 1/2006 | Penney ................ G11C 7/1018 711/5 |
| 2011/0035644 A1* | 2/2011 | Madan ................ G06F 11/1048 714/758 |
| 2015/0098282 A1* | 4/2015 | Lee ...................... G11C 7/1018 365/193 |

FOREIGN PATENT DOCUMENTS

| KR | 100846394 | 7/2008 |
| KR | 1020140028362 | 3/2014 |

* cited by examiner

*Primary Examiner* — Richard Elms
*Assistant Examiner* — Ajay Ojha
(74) *Attorney, Agent, or Firm* — IP & T Group LLP

(57) ABSTRACT

A memory device includes: a plurality of first lines; a plurality of second lines; a plurality of bank groups each including a predetermined number of banks; and a column signal transmission unit suitable for transmitting one or more column command signals and one or more column address signals to the bank groups through the first lines based on an odd-numbered column command, and transmitting the column command signals and the column address signals to the bank groups through the second lines based on an even-numbered column command.

20 Claims, 14 Drawing Sheets

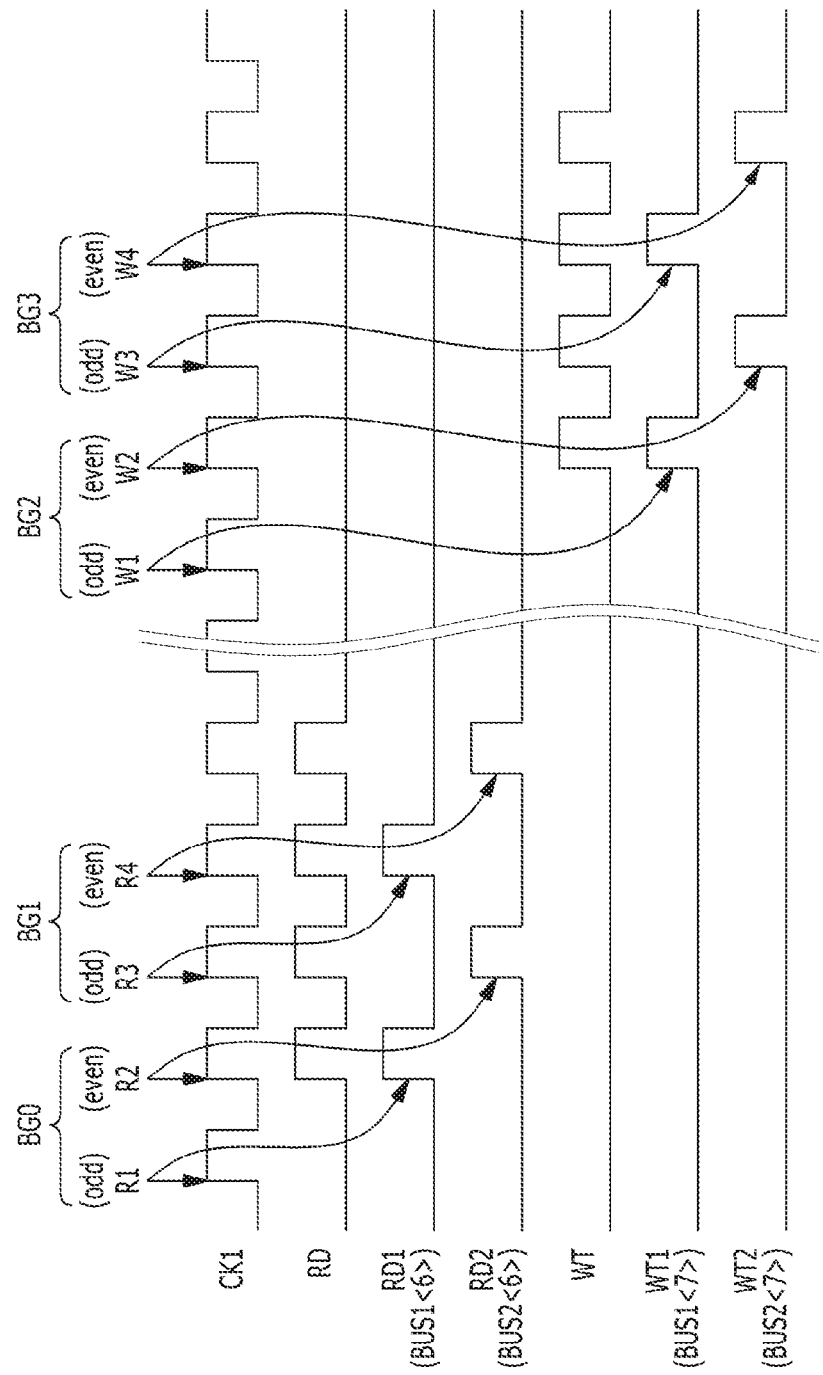

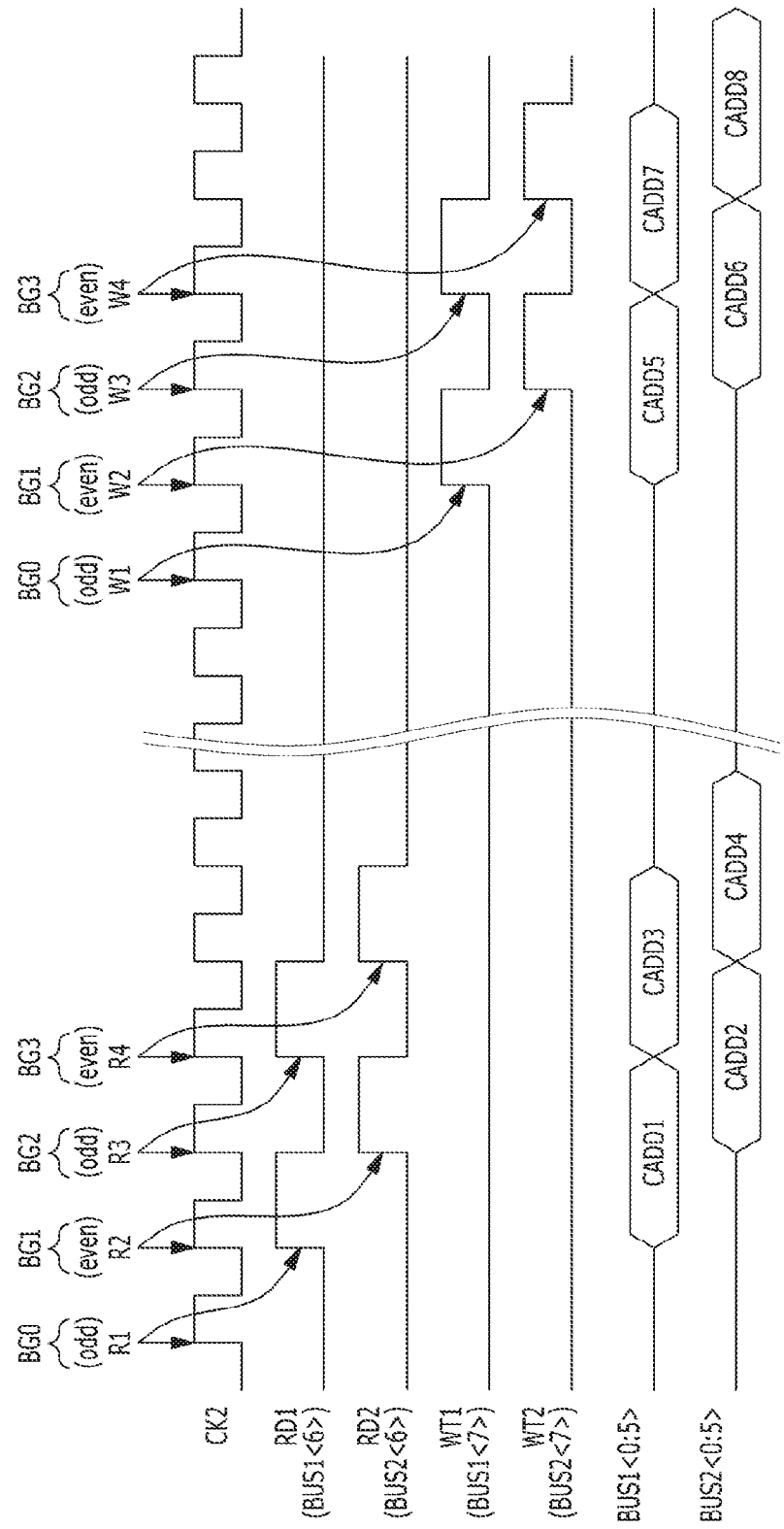

MEMORY DEVICE WITH PARALLEL ODD AND EVEN COLUMN ACCESS AND METHODS THEREOF

CROSS-REFERENCE TO RELATED APPLICATIONS

The present application claims priority of Korean Patent Application No. 10-2015-0081145, filed on Jun. 9, 2015, which is incorporated herein by reference in its entirety.

BACKGROUND

1. Field

Various embodiments of the present invention relate to a memory device.

2. Description of the Related Art

In general, memory devices activate a row (i.e., a word line) selected by a row address when an active command is inputted from a memory controller, and access (e.g., read or write) a memory cell coupled to a column (i.e., a bit line) selected by a column address among memory cells coupled to the activated row when a data write command or data read command is inputted.

The memory devices include a cell array in which a plurality of memory cells are arranged in rows and columns, and a group of a cell array, which corresponds to a bank address, is referred to as a memory bank (hereafter, referred to as a bank). The memory devices include a plurality of banks, and the banks may be divided into bank groups each including a predetermined number of banks. The memory devices perform an operation corresponding to a write or read command on the basis of a bank group.

FIG. 1A is a diagram illustrating a conventional memory device.

Referring to FIG. 1A, the memory device includes a command/address control unit 110 and first to fourth bank groups BG0 to BG3. Each of the bank groups BG0 to BG3 includes four banks BK0 to BK15.

The command/address control unit 110 transmits a column command signal RD/WT and a column address signal CADD<0:5> having a multiple bits to the respective bank groups BG0 to BG3 through lines BUS<0:7>. When the column command signal RD/WT and the column address signal CADD<0:5> are received, each of the bank groups BG0 to BG3 activates a column select signal by decoding the column command signal RD/WT and the column address signal CADD<0:5>, and write data to a memory cell coupled to a column corresponding to the activated column select signal or read data from the memory cell.

FIG. 1B is a timing diagram for describing an operation of the memory device illustrated in FIG. 1A.

When column commands R1 to R4 and W1 to W4 are successively inputted to the memory device, the column command signals RD and WT are successively activated, and the values of the column address signals CADD1 to CADD8 inputted with the column commands may be maintained from when a corresponding column command signal RD or WT is activated to when the next column command signal is activated. The column commands R1 to R4 correspond to the column address signals CADD1 to CADD4, and the column commands W1 to W4 correspond to the column address signals CADD5 to CADD8, respectively.

When the column commands are inputted at each clock cycle as illustrated in FIG. 1B, the respective column address signals CADD1 to CADD8 are maintained for one clock cycle. With the increase in operating frequency of the memory device, one cycle tCK of a clock CK has shortened. The increase of the clock frequency reduces the widths of the command signals RD and WT and the column address signal CADD<0:5>, thereby causing the reduction in a timing margin.

In order to prevent the timing margin from reducing, the memory device of FIG. 1A may include separate lines, which correspond to the respective bank groups, for transmitting the command signals WT and RD and the column address signal CADD<0:5> to the respective bank groups. As such, when the command/address signal transmission lines are provided for the respective bank groups, the column address signals may be maintained until the next bank group is accessed after a certain bank group is accessed, in case where the same bank group is not successively accessed. Thus, the timing margin may be increased. However, since the number of lines for transmitting the command signals and the column address signal is significantly increased as the number of bank groups is increased, the circuit area of the memory device inevitably increases.

SUMMARY

Various embodiments are directed to a memory device capable of securing a sufficient timing margin for transmitting command/address signals to each bank group, while minimizing the number of lines for transmitting command/address signals.

In an embodiment, a memory device may include a plurality of first lines; a plurality of second lines; a plurality of bank groups each including a predetermined number of banks; and a column signal transmission unit suitable for transmitting one or more column command signals and one or more column address signals to the bank groups through the first lines based on an odd-numbered column command, and transmitting the column command signals and the column address signals to the bank groups through the second lines based on an even-numbered column command.

In an embodiment, a memory device may include: a plurality of first lines; a plurality of second lines; a plurality of bank groups each including a predetermined number of banks; an additional column signal generation unit suitable for generating one or more additional column command signals by delaying one or more column command signals corresponding to a column command, and generating one or more additional column address signals by delaying one or more column address signals; and a column signal transmission unit suitable for transmitting the column command signals and the column address signals to the bank groups through the first lines and transmitting the additional column command signals and the additional column address signals to the bank groups through the second lines.

In an embodiment, a memory device may include: a plurality of first lines; a plurality of second lines; a plurality of bank groups each including a predetermined number of banks; an additional column signal generation unit suitable for generating one or more additional column command signals by delaying one or more column command signals corresponding to a column command, and generating one or more additional column address signals by delaying one or more column address signals, when the memory device is set to operate in a long burst mode; and a column signal transmission unit suitable for transmitting the column command signals and the column address signals to the bank groups through the first lines based on an odd-numbered column command and transmitting the column command signals and the column address signals to the bank groups through the second lines based on an even-numbered column command, when the memory device is set to operate in a short burst mode, and transmitting the column command signals and the column address signals to the bank groups through the first lines and transmitting the additional column command signals and the additional column address signals to the bank groups through the second lines, when the memory device is set to operate in the long burst mode.

BRIEF DESCRIPTION OF THE DRAWINGS

FIGS. 4A and 4B are timing diagrams for describing an operation of the column signal transmission unit shown in FIG. 3

FIGS. 5A and 5B are timing diagrams for describing an operation of the memory device shown in FIG. 2.

DETAILED DESCRIPTION

Figure 1A:
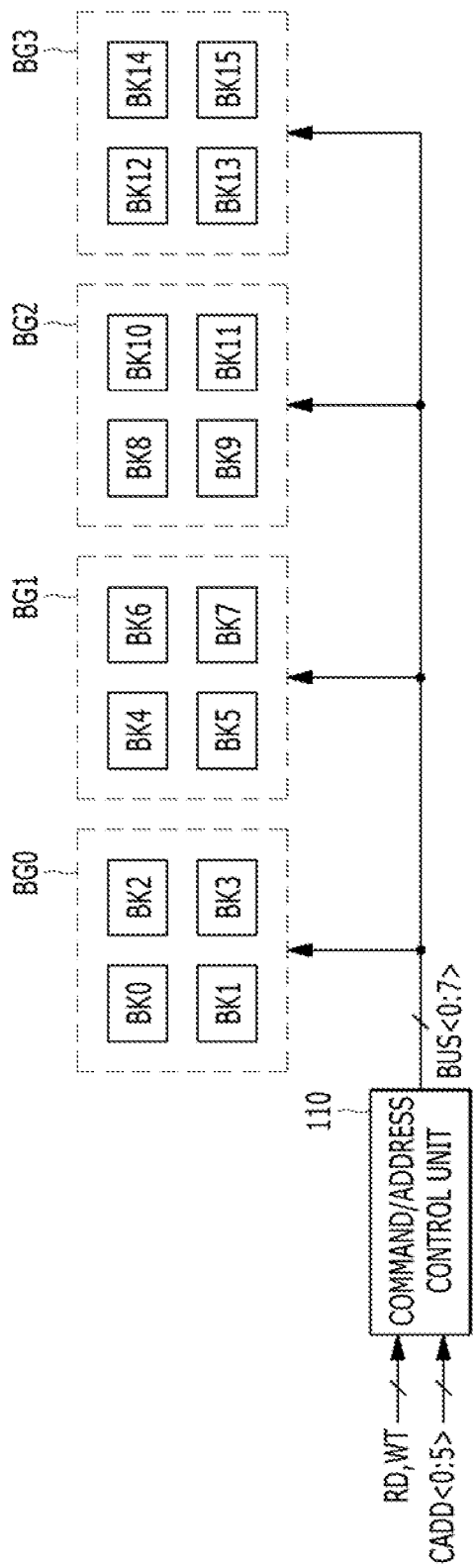
FIG. 1A is a diagram illustrating a conventional memory device.
Figure 1B:
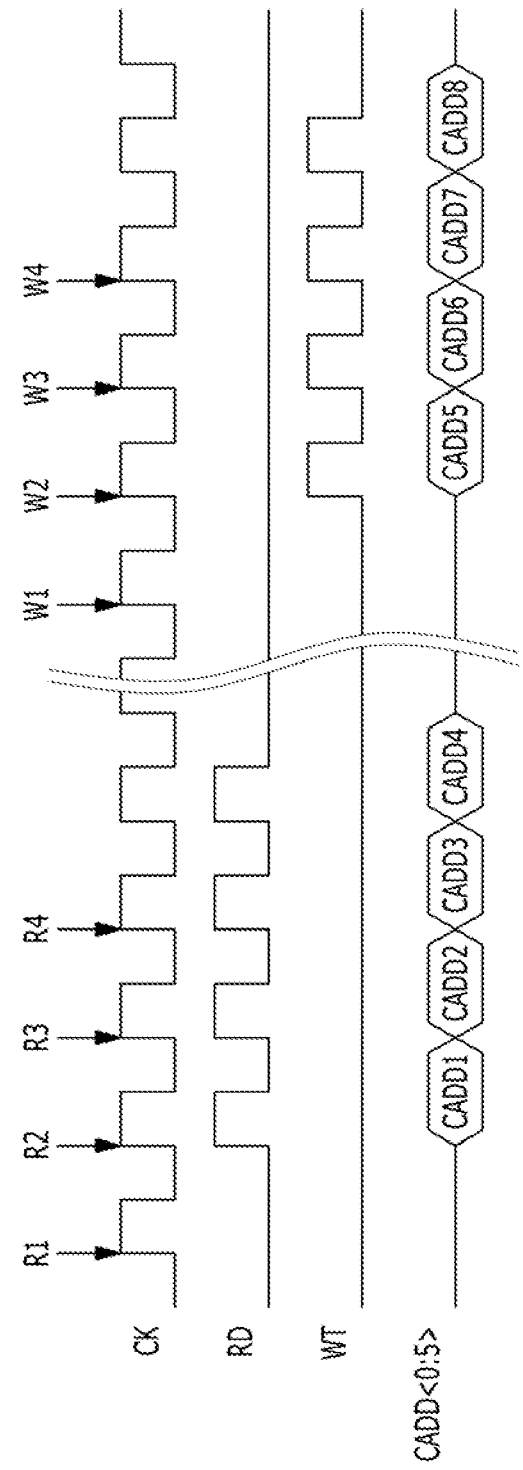
FIG. 1B is a timing diagram for describing an operation of the memory device illustrated in FIG. 1A.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereafter, a bank group mode may refer to an operation mode in which one bank group among a plurality of bank groups is not successively accessed, but bank groups are alternately accessed. More specifically, when a memory device is set to operate in the bank group mode, a column command (i.e., a read or write command) for a certain bank group cannot be inputted two or more times in a row. When a column command is successively inputted, only a bank group different from the bank group selected by the immediately previous column command may be selected at all times. When the memory device is set not to operate in the bank group mode, a column command for a certain bank group may be inputted two or more times.

A short burst mode may refer to an operation mode in which N data are accessed at a time in a selected bank group among a plurality of bank groups, and a long burst mode may refer to an operation mode in which 2N data are accessed at a time in a selected bank group among the plurality of bank groups, where N is a natural number equal to or more than 2. Hereafter, the case in which N is 2 will be taken as an example for description. That is, in the short burst mode, two data may be accessed at a time in a selected bank group, and in the long burst mode, four data may be accessed at a time in a selected bank group.

Figure 2:
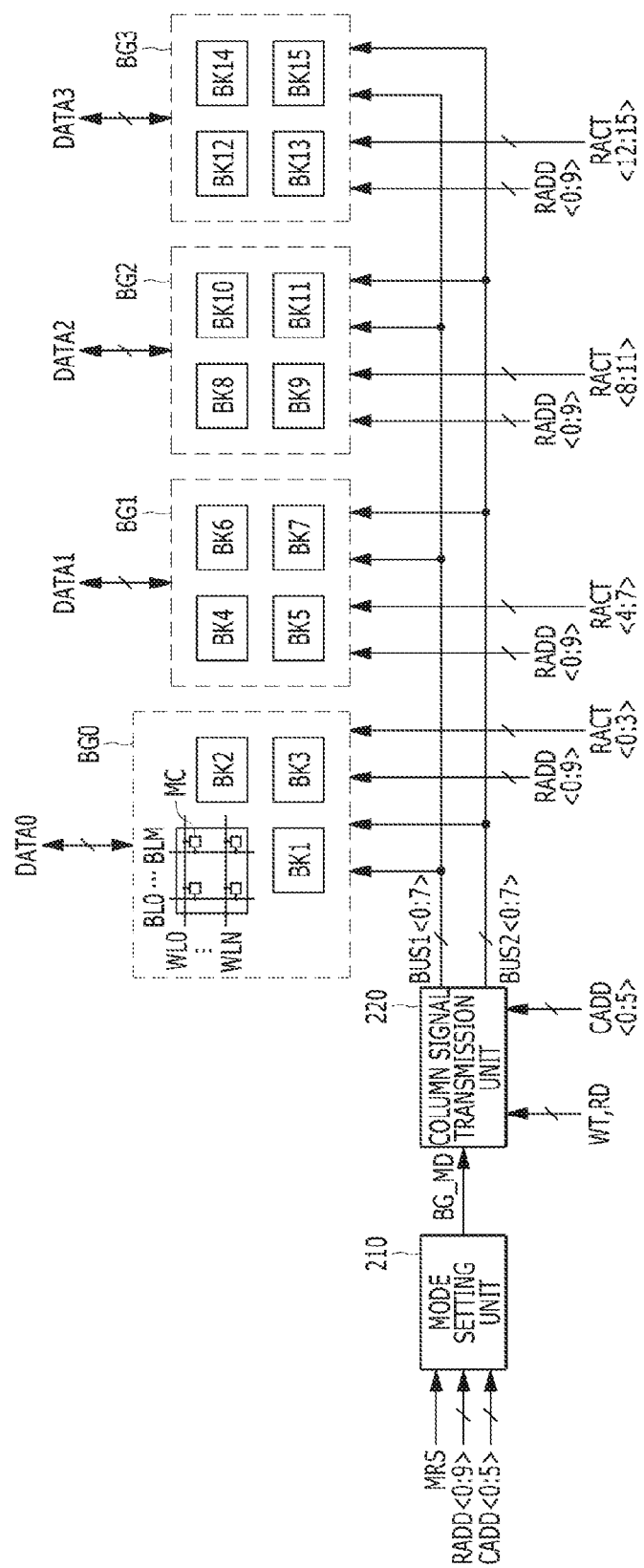
FIG. 2 is a diagram illustrating a memory device in accordance with an embodiment of the present invention.

FIG. 2 is a diagram illustrating a memory device in accordance with an embodiment of the present invention.

Referring to FIG. 2, the memory device may include a mode setting unit 210, a column signal transmission unit 220, a plurality of bank groups BG0 to BG3, first lines BUS1<0:7>, and second lines BUS2<0:7>. In the memory device of FIG. 2, two data may be outputted from a selected bank group in response to a single read command, and two data may be written in a selected bank group in response to a single write command.

The bank groups BG0 to BG3 may include a plurality of banks BK0 to BK15. Each of the banks BK0 to BK15 may include a plurality of word lines WL0 to WLN, a plurality of bit lines BL0 to BLM, and a plurality of memory cells MC coupled between the word lines WL0 to WLN and the bit lines BL0 to BLM. FIG. 2 illustrates only the word lines, the bit lines, and the memory cells of the bank BK0, for convenience of illustration.

A write command signal WT may be activated when a write command is inputted, a read command signal RD may be activated when a read command is inputted, and a mode setting command MRS may be activated when a mode setting command is inputted. The write command and the read command may correspond to column commands for controlling a column operation (i.e., an access to a bit line) of a bank. Hereafter, a column command signal corresponding to a column command and the column address signal will be referred to as column command/address (CA) signals.

When the mode setting command MRS is activated, the mode setting unit 210 may selectively set a bank group mode of the memory device according to one or more address signals among row address signals RADD<0:9> and column address signals CADD<0:5>. The mode setting unit 210 may activate a bank group mode signal BG_MD when the memory device is set to operate in the bank group mode, or deactivate the bank group mode signal BG_MD when the memory device is set not to operate in the bank group mode.

Bank active signals RACT<0:15> may correspond to the respective banks BK0 to BK15. When an active command is inputted, a bank active signal corresponding to a bank selected by a bank address (not illustrated in FIG. 2) may be activated, and when a precharge command is inputted, the activated bank active signal may be deactivated. Each of the banks BK0 to BK15 may activate a word line corresponding to the row address signals RADD<0:9> while a corresponding bank active signal is activated.

The column signal transmission unit 220 may transmit CA signals corresponding to an odd-numbered column command to the bank groups BG0 to BG3 through the first lines BUS1<0:7>, and transmit CA signals corresponding to an even-numbered column command to the bank groups BG0 to BG3 through the second lines BUS2<0:7>.

More specifically, the column signal transmission unit 220 may determine whether an activated column command signal WT/RD is an odd-numbered or even-numbered column command signal. According to the determination result, the column signal transmission unit 220 may transmit the odd-numbered column command signal WT/RD and the corresponding column address signals CADD<0:5> to the first lines BUS1<0:7>, and transmit the even-numbered column command signal WT/RD and the corresponding column address signals CADD<0:7> to the second lines BUS2<0:7>. That is, the column signal transmission unit 220 may transmit CA signals to the bank groups BG0 to BG3 by alternately using the first lines BUS1<0:7> and the second lines BUS2<0:7>.

When the bank group mode is set, the column signal transmission unit 220 may expand the pulse width of the column command signal WT/RD and transmit the column command signal to the first or second lines BUS1<0:7> or BUS2<0:7>. When the bank group mode is not set, the column signal transmission unit 220 may not expand the column command signal WT/RD, but transmit the column command signal WT/RD to the first or second lines BUS1<0:7> or BUS2<0:7>.

A bank group including an activated bank may perform a column operation in response to the CA signals transmitted through the first or second lines BUS1<0:7> or BUS2<0:7>. More specifically, the bank group may combine the column command signal WT/RD and the column address signals CADD<0:5> and generate a column select signal (not illustrated in FIG. 2) for selecting a column (i.e., a bit line). Data may be written to memory cells coupled to a bit line corresponding to an activated column select signal among memory cells coupled to an activated word line, or read from the memory cells. DATA0 to DATA3 may represent data input/output in the respective bank groups.

Figure 3:
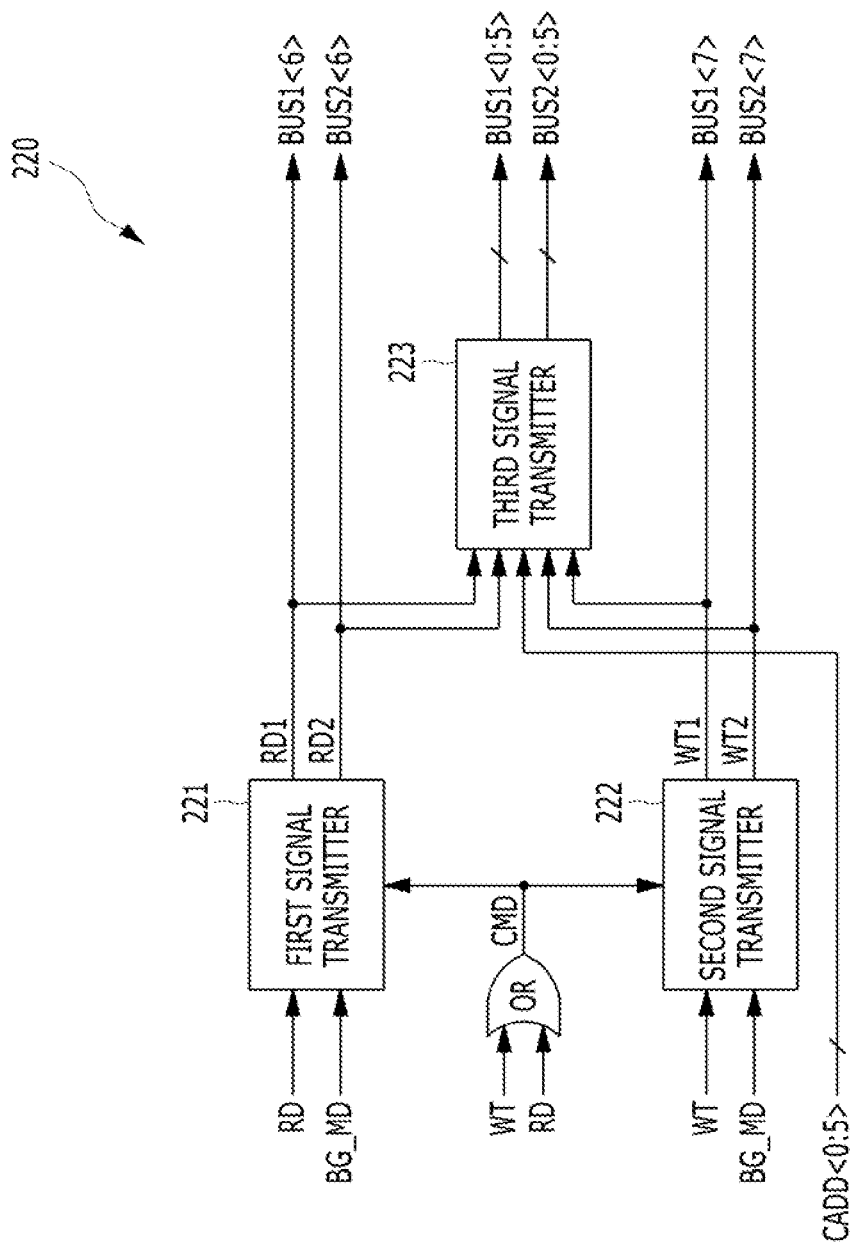
FIG. 3 is a detailed diagram of a column signal transmission unit.

FIG. 3 is a detailed diagram of the column signal transmission unit 220 shown in FIG. 2.

Referring to FIG. 3, the column signal transmission unit 220 may include first to third signal transmitters 221 to 223.

The first signal transmitter 221 may transmit a read command signal RD as a first read command signal RD1 when a read command is an odd-numbered column command, and transmit the read command signal RD as a second read command signal RD2 when the read command is an even-numbered column command. The first signal transmitter 221 may count how many times a command signal CMD was activated, and determine whether the read command is an odd-numbered or even-numbered command. For reference, the command signal CMD may indicate a signal which is activated when a read or write command signal RD or WT is activated. The command signal CMD may be obtained by performing an OR operation on the read command signal RD and the write command signal WT. The first signal transmitter 221 may expand the pulse width of the first and second read command signals RD1 and RD2 when the bank group mode is set, or not expand the pulse width of the first and second read command signals RD1 and RD2 when the bank group mode is not set.

The second signal transmitter 222 may transmit a write command signal WT as a first write command signal WT1 when a write command is an odd-numbered column command, and transmit the write command signal WT as a second write command signal WT2 when the write command is an even-numbered column command. The second signal transmitter 222 may count how many times the command signal CMD was activated, and determine whether the write command is an odd-numbered or even-numbered command. The second signal transmitter 222 may expand the pulse width of the first and second write command signals WT1 and WT2 when the bank group mode is set, or not expand the pulse width of the first and second write command signals WT1 and WT2 when the bank group mode is not set.

The third signal transmitter 223 may transmit the column address signals CADD<0:5> to the first lines BUS1<0:5> when the first read or write command signal RD1 or WT1 is activated, and transmit the column address signals CADD<0:5> to the second lines BUS2<0:5> when the second read or write command signal RD2 and WT2 is activated.

When the column command is an odd-numbered command, the column address signals CADD<0> to CADD<5> and the first read and write commands RD1 and WT1 may be transmitted to the bank groups BG0 to BG3 through the lines BUS1<0> to BUS1<7>. When the column command is an even-numbered command, the column address signals CADD<0> to CADD<5> and the second read and write commands RD2 and WT2 may be transmitted to the bank groups BG0 to BG3 through the lines BUS2<0> to BUS2<7>.

FIG. 4A is a timing diagram for describing an operation of the first and second signal transmitters 221 and 222 shown in FIG. 3 when the bank group mode is not set.

Referring to FIG. 4A, ODD represents an odd-numbered column command, EVEN represents an even-numbered column command, W represents a write command, and R represents a read command. Hereafter, the operation of the first and second signal transmitters 221 and 222 when read commands R1 to R4 and write commands W1 to W4 are successively inputted will be described. A number after R or W represents the order that the corresponding column command was inputted.

When the read commands R1 to R4 are inputted, a read command signal RD may be activated after one clock cycle. Since the read commands R1 and R3 are odd-numbered column commands, the first read command signal RD1 may be activated. Furthermore, since the read commands R2 and R4 are even-numbered column commands, the second read command signal RD2 may be activated. When write commands W1 to W4 are inputted, a write command signal WT may be activated after one clock cycle. Since the write commands W1 and W3 are odd-numbered column commands, the first write command signal WT1 may be activated. Furthermore, since the write commands W2 and W4 are even-numbered column commands, the second write command signal WT2 may be activated.

Even after that, when a read command is inputted as an odd-numbered command, the read command signal RD and the first read command signal RD1 may be activated, and when a read command is inputted as an even-numbered command, the read command signal RD and the second read command signal RD2 may be activated. Furthermore, when a write command is inputted as an odd-numbered command, the write command signal WT and the first write command signal WT1 may be activated, and when a write command is inputted as an even-numbered command, the write command signal WT and the second write command signal WT2 may be activated. At this time, the command signals RD, RD1, RD2, WT, WT1, and WT2 may have a pulse width corresponding to 0.5 clock cycle. CK1 may represent a clock signal with which the memory device is operated in synchronization.

Figure 4B:
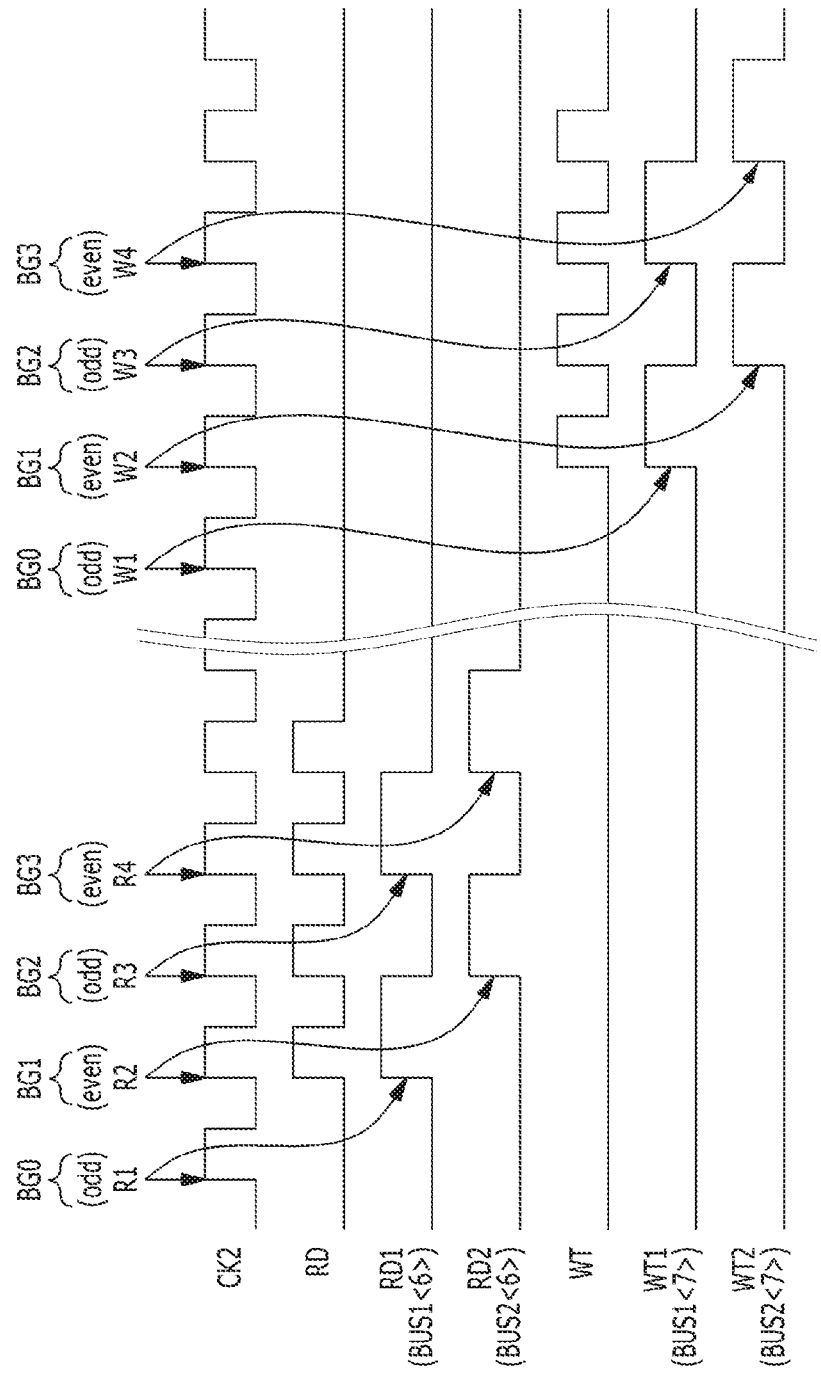

FIG. 4B is a timing diagram for describing an operation of the first and second signal transmitters 221 and 222 shown in FIG. 3 when the bank group mode is set.

Referring to FIG. 4B, ODD represents an odd-numbered column command, EVEN represents an even-numbered column command, W represents a write command, and R represents a read command. Hereafter, the operation of the first and second signal transmitters 221 and 222 when read commands R1 to R4 and write commands W1 to W4 are successively inputted will be described. A number after R or W represents the order that the corresponding column command was inputted When the read commands R1 to R4 are inputted, a read command signal RD may be activated after one clock cycle. Since the read commands R1 and R3 are odd-numbered column commands, the first read command signal RD1 may be activated. Furthermore, since the read commands R2 and R4 are even-numbered column commands, the second read command signal RD2 may be activated. When write commands W1 to W4 are inputted, a write command signal WT may be activated after one clock cycle. Since the write commands W1 and W3 are odd-numbered column commands, the first write command signal WT1 may be activated. Furthermore, since the write commands W2 and W4 are even-numbered column commands, the second write command signal WT2 may be activated.

When the bank group mode is set, the pulse width of the command signals RD1, RD2, WT1, and WT2 may be expanded to one clock cycle, unlike the case of FIG. 4A. CK2 may represent a clock signal with which the memory device is operated in synchronization. For reference, one cycle tCK2 of the clock signal CK2 may be shorter than one cycle tCK1 of the clock signal CK1.

Figure 5A:
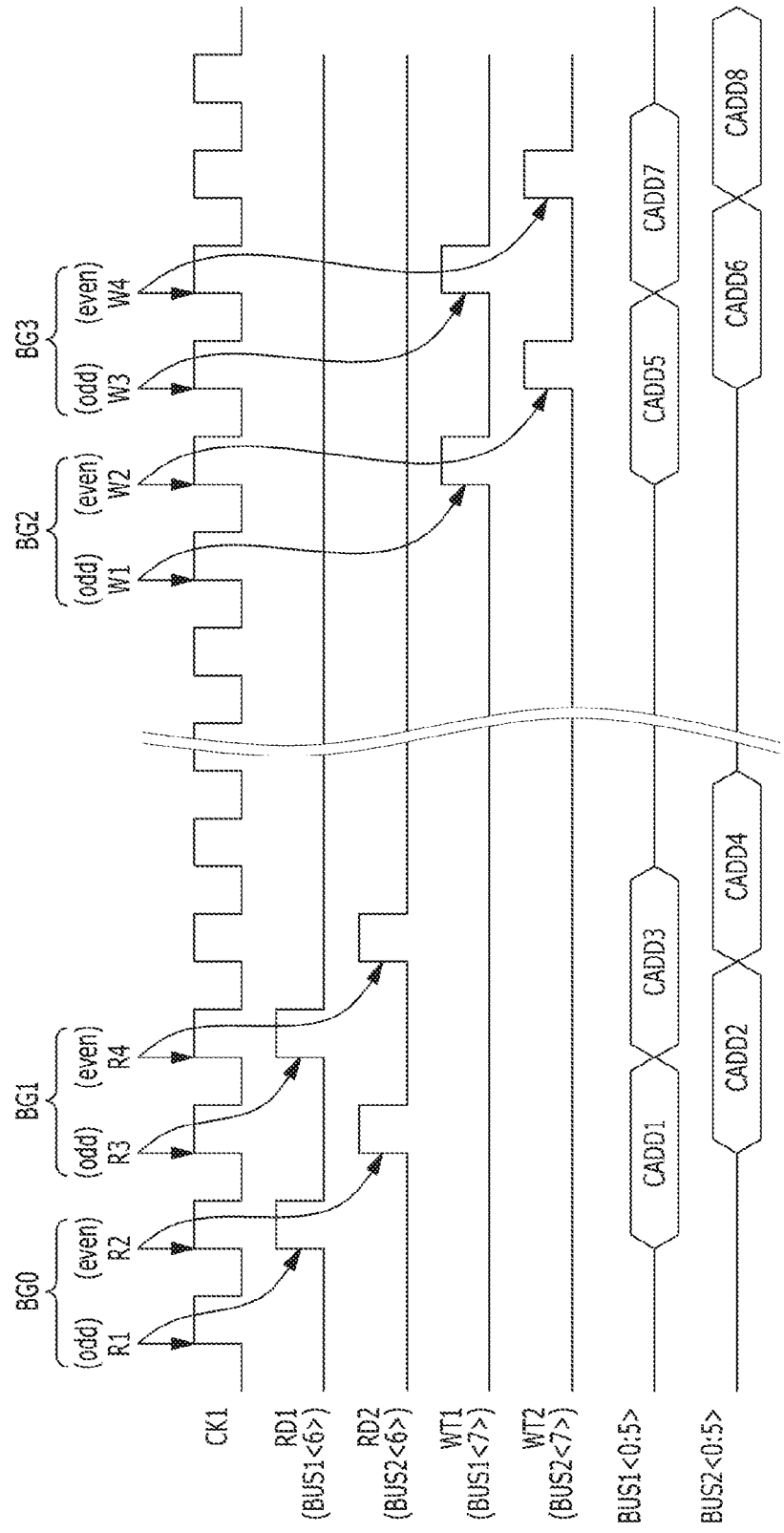

FIGS. 5A and 5B are timing diagrams for describing an operation of the memory device shown in FIG. 2.

Referring to FIGS. 5A and 5B, ODD represents an odd-numbered column command, EVEN represents an even-numbered column command, W represents a write command, and R represents a read command. Hereafter, the operation of the memory device when read commands R1 to R4 and write commands W1 to W4 are successively inputted will be described as follows. Suppose that a word line coupled to a memory cell to be accessed is activated before a column command is applied.

FIG. 5A shows the operation of the memory device when the memory device is set not to operate in the bank group mode. Since the memory device is set not to operate in the bank group mode, column commands for one bank group may be successively inputted. In FIG. 5A, R1 and R2 represent read commands for the bank group BG0, R3 and R4 represent read commands for bank group BG1, W1 and W2 represent write commands for bank group BG2, and W3 and W4 represent write commands for bank group BG3.

When the read commands R1 and R3 are inputted, the first read command signal RD1 may be activated, and when the read commands R2 and R4 are inputted, the second read command signal RD2 may be activated. Furthermore, when the write command W1 and W3 are inputted, the write command signal WT1 may be activated, and when the write command W2 and W4 are inputted, the write command signal WT2 may be activated. The signals RD1, RD2, WT1, and WT2 may have a pulse width corresponding to 0.5 clock cycle. The values of the column address signals transmitted to the first and second lines BUS1<0:5> and BUS2<0:5> may be maintained from when a corresponding column command signal is activated to when the next column command signal is activated. Thus, the column address signals CADD1 to CADD8 may be maintained during two clock cycles. In each of the bank groups, memory cells selected by the column address signals CADD1 to CADD8 may be accessed.

FIG. 5B shows the operation of the memory device when the memory device is set to operate in the bank group mode. Since the memory device is set to operate in the bank group mode, column commands for one bank group cannot be successively inputted. In 5B, R1 to R4 represent read commands for the respective bank groups BG0 to BG3, and W1 to W4 represent write commands for the respective bank groups BG0 to BG3. The operation of the memory device of FIG. 5B may be performed in the same manner as the operation of the memory device of FIG. 5A, except that the pulse width of the command signals RD1, RD2, WT1, and WT2 is one clock cycle. One cycle tCK2 of the clock CK2 with which the memory device of FIG. 5B is operated in synchronization may be shorter than one cycle tCK1 of the clock CK1 with which the memory device of FIG. 5A is operated in synchronization.

The reason to expand the pulse width of the commands RD1, RD2, WT1, and WT2 when the memory device is set to operate in the bank group mode may be described as follows. For a normal operation of the memory device, the pulse width of the command signals RD1, RD2, WT1, and WT2 needs to be set to a predetermined time or more. For example, suppose that the pulse width of the command signals RD1, RD2, WT1, and WT2 needs to be equal to or more than 1 ns, for a normal operation of the memory device. When the frequency of a clock signal with which the memory device is operated in synchronization becomes larger than 500 MHz, the cycle of a clock becomes smaller than 2 ns. Thus, 0.5 clock cycle becomes smaller than 1 ns. In this case, the memory device may not be normally operated. Thus, as the pulse width of the command signals RD1, RD2, WT1, and WT2 is expanded to one clock cycle, the memory device may be normally operated at high speed in a range where the frequency of the clock signal is larger than 500 MHz.

Furthermore, when the frequency of the clock signal becomes equal to or more than a predetermined value, the memory device may not normally operated in case where column commands corresponding to one bank group are successively inputted, because the operating speed of each bank group is limited. Thus, when the frequency of the clock signal becomes equal to or more than the predetermined value, the memory device may be set to operate in the bank group mode. As column commands corresponding to one bank are not successively inputted in the bank group mode, the memory device may be normally operated at high speed.

Comparing FIGS. 1B to 5B, the timing margin of the memory device of FIG. 2 may be doubled. Furthermore, as the number of lines for transmitting CA signals in the memory device is maintained at a constant value (e.g., two times larger than the number of CA signals) regardless of the number of bank groups, the increase in area of the memory device may be minimized.

Figure 6:
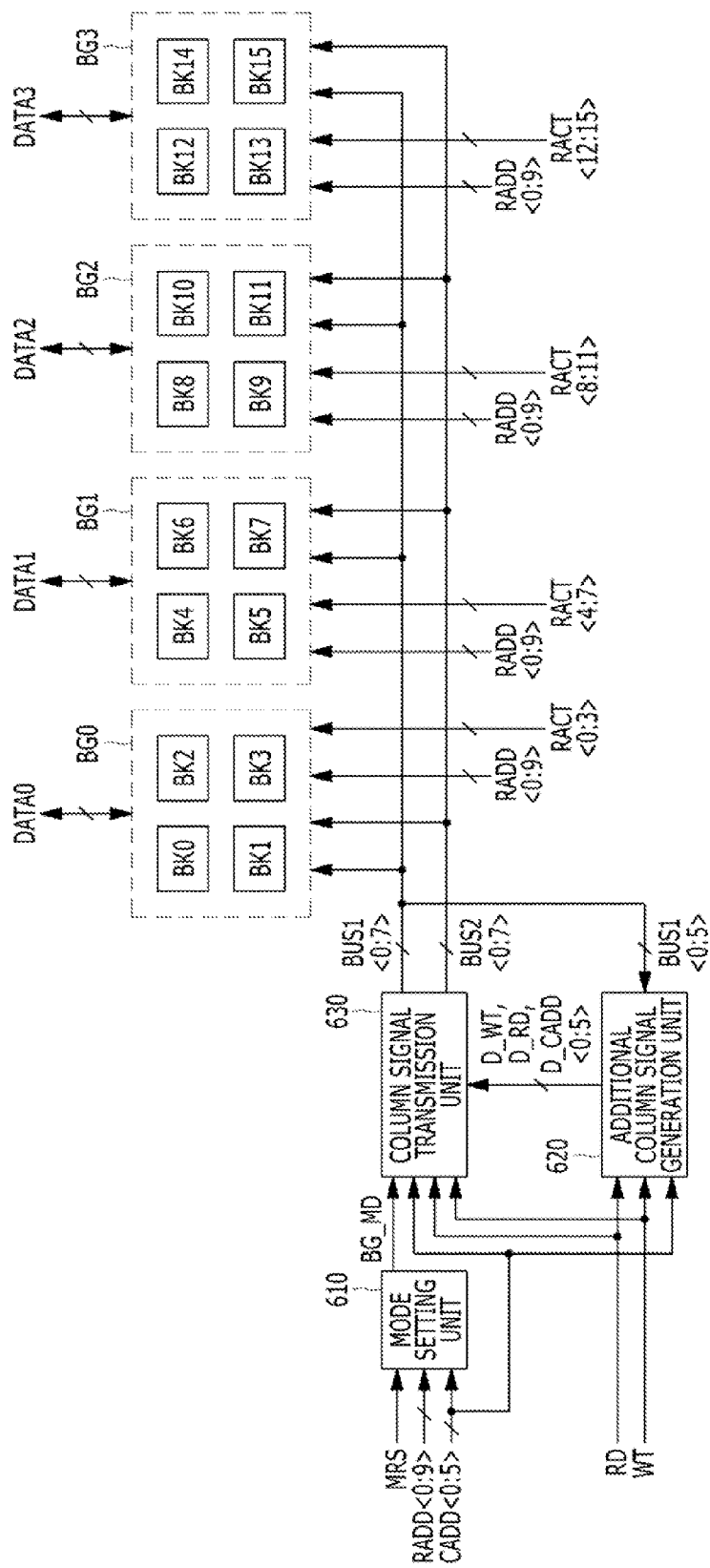
FIG. 6 is a diagram illustrating a memory device in accordance with an embodiment of the present invention.

FIG. 6 is a diagram illustrating a memory device in accordance with an embodiment of the present invention.

Referring to FIG. 6, the memory device may include a mode setting unit 610, an additional column signal generation unit 620, a column signal transmission unit 630, a plurality of bank groups BG0 to BG3, first lines BUS1<0:7>, and second lines BUS2<0:7>. In the memory device of FIG. 6, four data may be outputted from a selected bank group in response to one read command, and four data may be stored in a selected bank group in response to one write command. The mode setting unit 610 and the bank groups BG0 to BG3 may be configured and operated in the same manner as the mode setting unit 210 and the bank groups BG0 to BG3 of FIG. 2.

The additional column signal generation unit 620 may generate an additional read command signal D_RD by delaying a read command signal RD by one clock cycle, generate an additional write command signal D_WT by delaying a write command signal WT by one clock cycle, and generate additional column command signals D_CADD<0:5> by delaying the column address signals CADD<0:5> by one clock cycle.

The additional column signal generation unit 620 may invert the column address signal CADD<0> corresponding to the least significant bit of the column address signals CADD<0:5> and generate the additional column address signal D_CADD<0> corresponding to the least significant bit of the additional column address signals D_CADD<0:5>.

More specifically, the additional column signal generation unit 660 may generate the additional read command signal D_RD by delaying the read command signal RD by one clock cycle, generate the additional write command signal D_WT by delaying the write command signal WT by one clock cycle, and generate the additional column command signals D_CADD<0:5> by delaying the column address signals CADD<0:5> by one clock cycle.

When the value of the column address indicated by the column address signals CADD<0:5> is '100100', the most significant bit is 1, and the least significant bit is '0'. At this time, the value of the column address indicated by the additional column address signals D_CADD<0:5> may be set to '100101' obtained by inverting the least significant bit of the original column address value. Two columns (i.e., two bit lines) having column address values of which only the least significant bits are different from each other may correspond to columns adjacent to each other. For reference, the value of a column address may correspond to the number of a column. In the above-described example, a column corresponding to the column address indicated by the column address signals CADD<0:5> may be a 72nd column, and a column corresponding to the column address indicated by the additional column address signals D_CADD<0:5> may be a 73rd column.

The column signal transmission unit 630 may transmit the CA signals RD, WT, and CADD<0:5> to the bank groups BG0 to BG3 through the first lines BUS1<0:7>, and transmit the additional CA signals D_RD, D_WT, and D_CADD<0:5> to the bank groups BG0 to BG3 through the second lines BUS2<0:7>.

The column signal transmission unit 630 may transmit the column address signals CADD<0:5> to the first lines BUS1<0:5> when the read command signal RD or the write command signal WT is activated, and transmit the additional address signals D_ADD<0:5> to the second lines BUS2<0:5> when the additional read command signal D_RD or the additional write command signal D_WT is activated.

When the bank group mode is set, the column signal transmission unit 630 may delay the additional read or write command signal D_RD or D_WT by one clock cycle and transmit the delayed signal to the second lines BUS2<6:7>. Furthermore, the column signal transmission unit 630 may delay the additional column address signals D_CADD<0:5> by one clock cycle and transmit the delayed signals to the second lines BUS2<0:5>. When the bank group mode is not set, the column signal transmission unit 630 may not delay the additional read or write command signal D_RD or D_WT, but transmit the additional read or write command signal D_RD or D_WT to the second lines BUS2<6:7>. Furthermore, the column signal transmission unit 630 may not delay the additional column address signals D_CADD<0:5>, but transmit the additional column address signals D_CADD<0:5> to the second lines BUS2<0:5>.

When the bank group mode is set, the column signal transmission unit 630 may expand the pulse width of the read and write command signals RD and WT and the additional read and write command signals D_RD and D_WT. When the bank group mode is not set, the column signal transmission unit 630 may not expand the pulse width of the read and write command signals RD and WT and the additional read and write command signals D_RD and D_WT.

Figure 7:
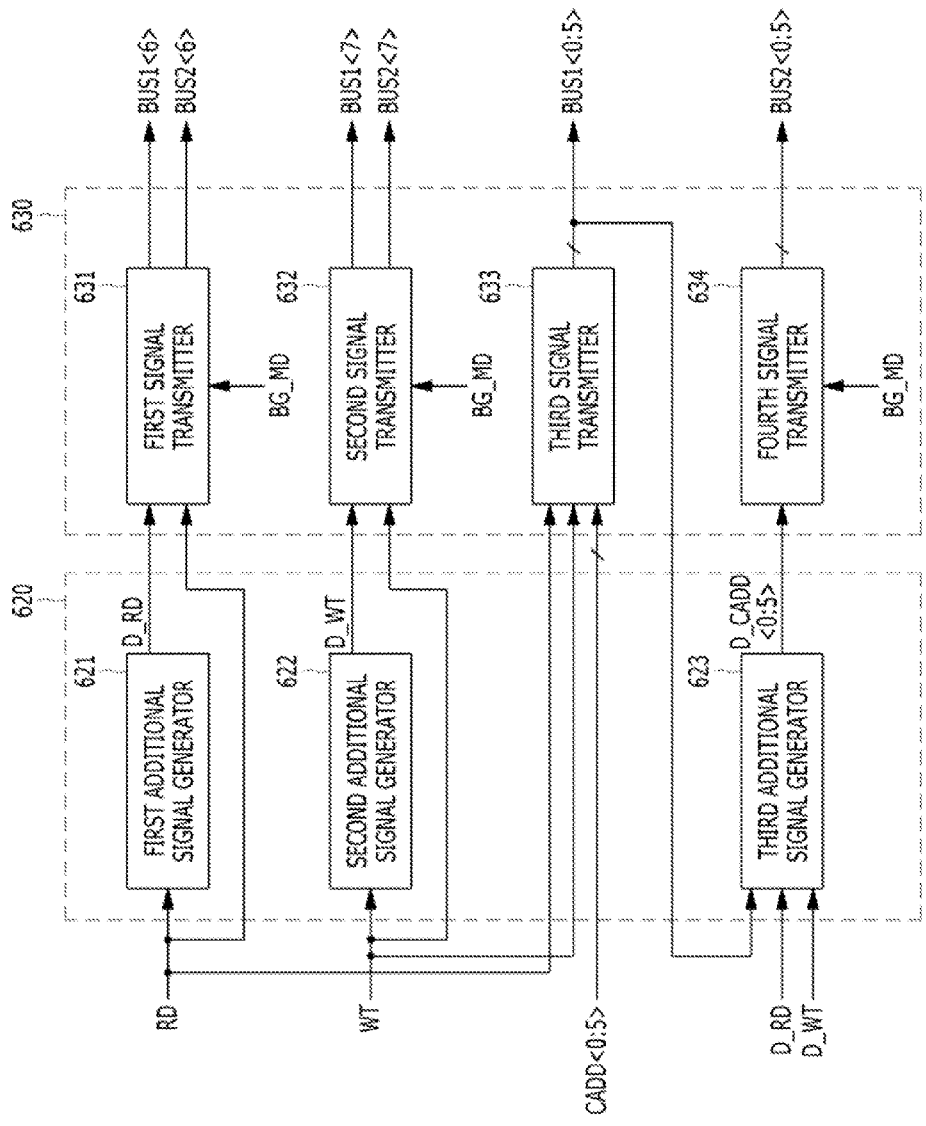
FIG. 7 is a detailed diagram of an additional column signal generation unit and a column signal transmission unit shown in FIG. 6.

FIG. 7 is a detailed diagram of the additional column signal generation unit 620 and the column signal transmission unit 630 shown in FIG. 6.

Referring to FIG. 7, the additional column signal generation unit 620 may include first to third additional signal generators 621 to 623, and the column signal transmission unit 630 may include first to fourth signal transmitters 631 to 634.

The first additional signal generator 621 may generate an additional read command signal D_RD by delaying the read command signal RD by one clock cycle. When the bank group mode signal BG_MD is deactivated, the first signal transmitter 631 may not delay the additional read command D_RD, but transmit the additional read command D_RD to the second line BUS2<6>. When the bank group mode signal BG_MD is activated, the first signal transmitter 631 may delay the additional read command signal D_RD by one clock cycle and transmit the delayed signal to the second line BUS2<6>. The first signal transmitter 631 may transmit the read command signal RD to the first line BUS1<6>. The first signal transmitter 631 may not expand the pulse width of the read command signal RD and the additional read command D_RD when the bank group mode signal BG_MD is deactivated, but expand the pulse width of the read command signal RD and the additional read command D_RD when the bank group mode signal BG_MD is activated.

The second additional signal generator 622 may be operated in the same manner as the first additional signal generator 621. That is, the second additional signal generator 622 may generate an additional write command signal by delaying the write command signal WT. The second signal transmitter 632 may be operated in the same manner as the first signal transmitter 631. That is, the second signal transmitter 632 may transmit the write command signal WT and the additional write command signal D_WT to the first line BUS1<7> and the second line BUS2<7>, respectively.

The third signal transmitter 633 may transmit the column address signals CADD<0:5> to the first lines BUS1<0:5> when the read command signal RD or the write command signal WT is activated. The column address signals CADD<0:5> may be transmitted to the third additional signal generator 623 and the bank groups BG0 to BG3 through the first lines BUS1<0:5>.

When the additional column command signal D_RD/D_WT is activated, the third additional signal generator 623 may generate the additional column address signals D_CADD<0:5> by delaying the column address signals CADD<0:5> by one clock cycle. At this time, the third additional signal generator 623 may generate the additional column address signal D_CADD<0> by inverting the column address signal CADD<0>.

When the bank group mode signal BG_MD is deactivated, the fourth signal transmitter 634 may not delay the additional address signals D_CADD<0:5>, but transmit the additional address signals D_CADD<0:5> to the second line BUS2<0:5>. When the bank group mode signal BG_MD is activated, the fourth signal transmitter 634 may delay the additional address signals D_CADD<0:5> by one clock cycle and transmit the delayed signals to the second line BUS2<0:5>.

Figure 8A:
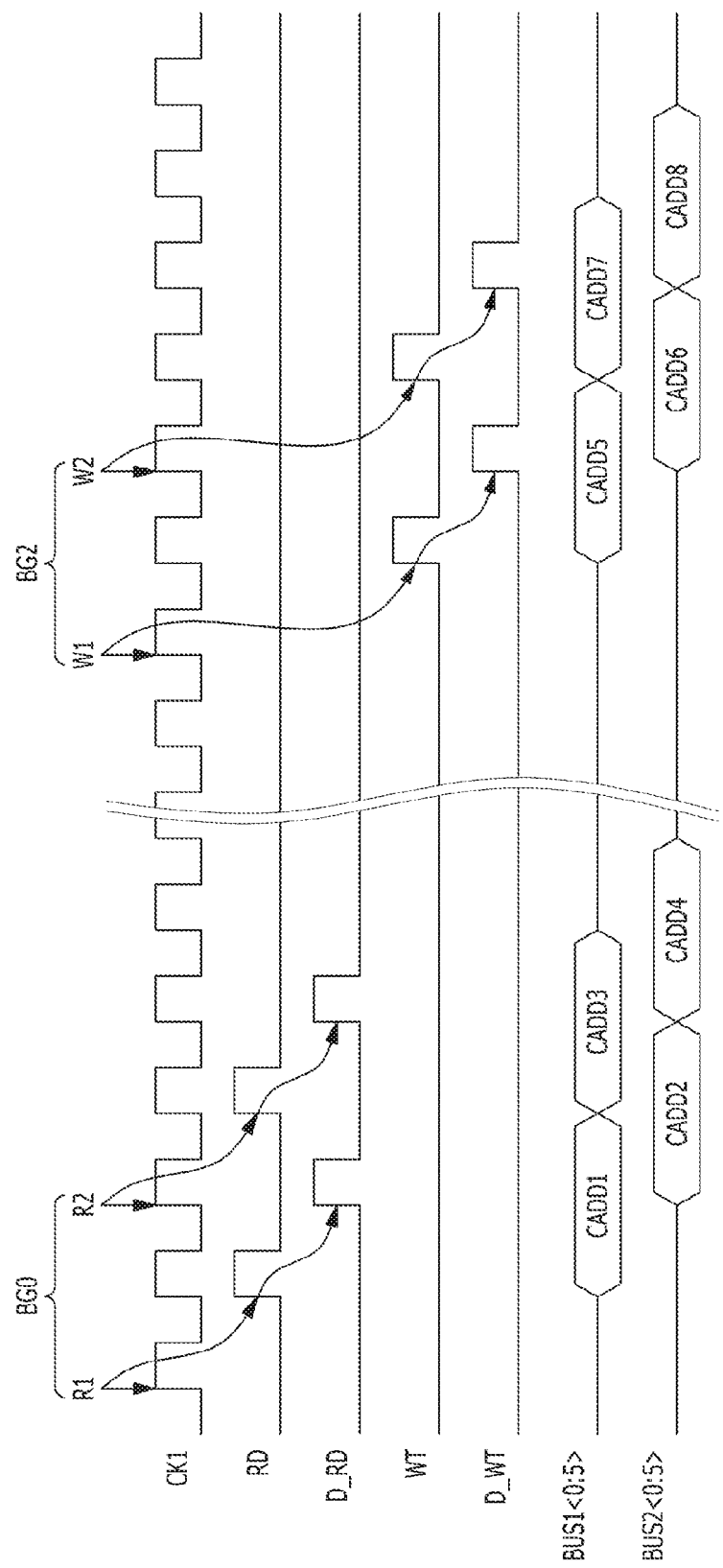
FIGS. 8A and 8B are diagrams for describing an operation of the memory device shown in FIG. 6.
Figure 8B:
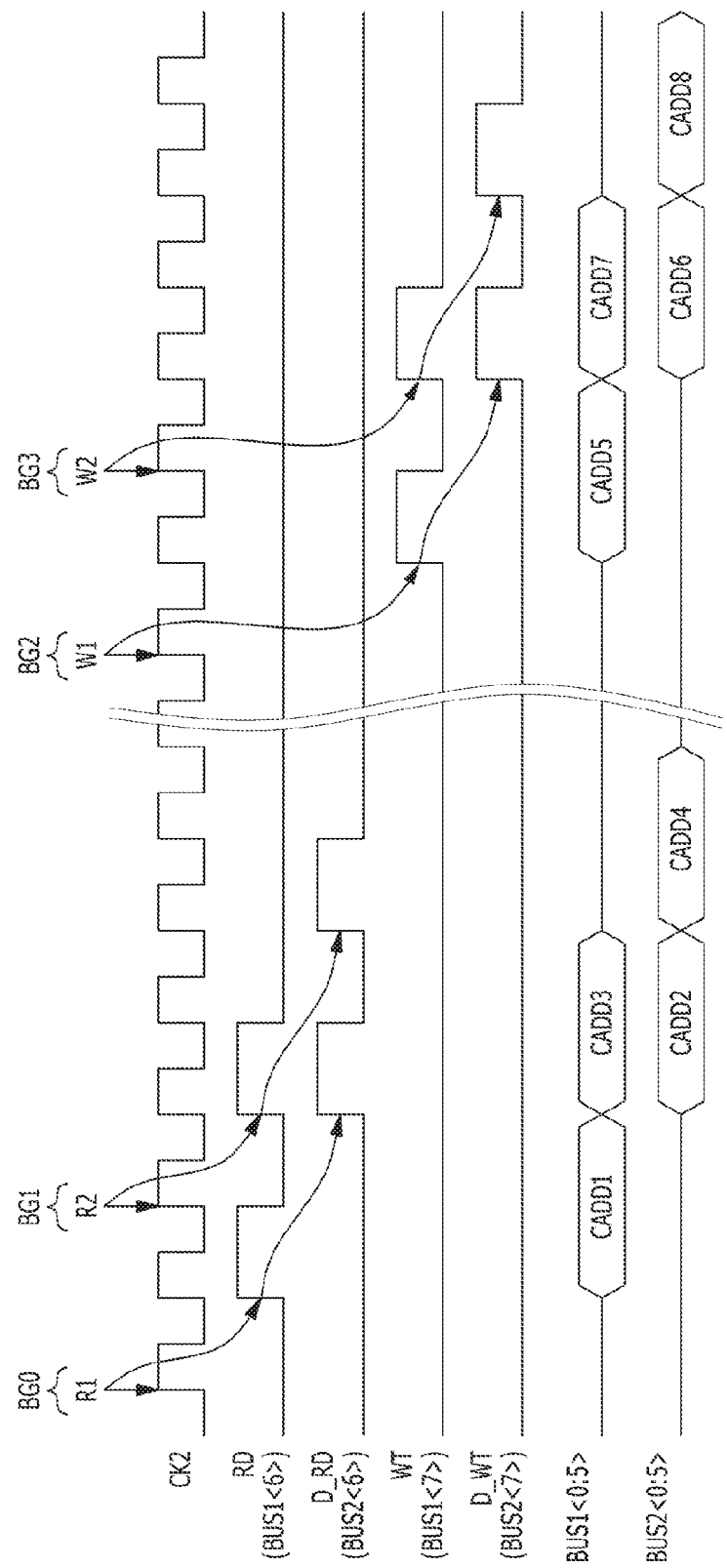

FIGS. 8A and 8B are diagrams for describing an operation of the memory device shown in FIG. 6.

FIG. 8A shows the operation of the memory device when the memory device is set not to operate in the bank group mode. Since the memory device is set not to operate in the bank group mode, column commands for one bank group may be successively inputted. In FIG. 8A, R1 and R2 represent read commands for the bank group BG0, and W1 and W2 represent write commands for the bank group BG2.

When the read commands R1 and R2 are inputted, the read command signal RD may be activated. When one clock cycle elapses after the read command signal RD is activated, the additional read command signal D_RD may be activated. When the write commands W1 and W2 are inputted, the write command signal WT may be activated. When one clock cycle elapses after the write command signal WT is activated, the additional write command D_WT may be activated. The command signals RD1, RD2, WT1, and WT2 may have a pulse width corresponding to 0.5 clock cycle. Thus, the column address signals CADD1 to CADD8 may be maintained during two clock cycles. In each of the bank groups, memory cells selected by the column address signals CADD1 to CADD8 may be accessed. For reference, the column address signals CADD2, CADD4, CADD6, and CADD8 may be obtained by inverting the least significant bits of the column address signals CADD1, CADD3, CADD5, and CADD7.

FIG. 8B shows the operation of the memory device when the memory device is set to operate in the bank group mode. Since the memory device is set to operate in the bank group mode, column commands for one bank group cannot be successively inputted. In FIG. 8B, R1, R2, W1, and W2 represent column commands for the bank groups BG0 to BG3, respectively. During the operation of the memory device of FIG. 8B, the command signals RD, D_RD, WT, and D_WT may have a pulse width corresponding to one clock cycle, and the additional column command signals D_RD and D_WT and the additional column address signals D_CADD<0:5> may be further delayed by one clock cycle.

The reason why the additional column command signals D_RD and D_WT and the additional column address signals D_CADD<0:5> are further delayed by one clock cycle may be described as follows. As described above, the bank group mode may refer to an operation mode in which the same bank group is not successively accessed. In the memory device of FIG. 6, however, one bank group may be accessed two times in a row in response to a single column command. Since the bank group mode corresponds to a high-frequency operation, a timing margin is not sufficient when one bank group is successively accessed. Thus, in order to secure a sufficient timing margin, the additional column command signals D_RD and D_WT and the additional column address signals D_CADD<0:5> may be further delayed by one clock cycle.

The timing margin of the memory device of FIG. 6 may be doubled like the memory device of FIG. 2. Furthermore, as the number of lines for transmitting CA signals is constantly maintained regardless of the number of bank groups in the memory device, the increase in area of the memory device may be minimized.

Figure 9:
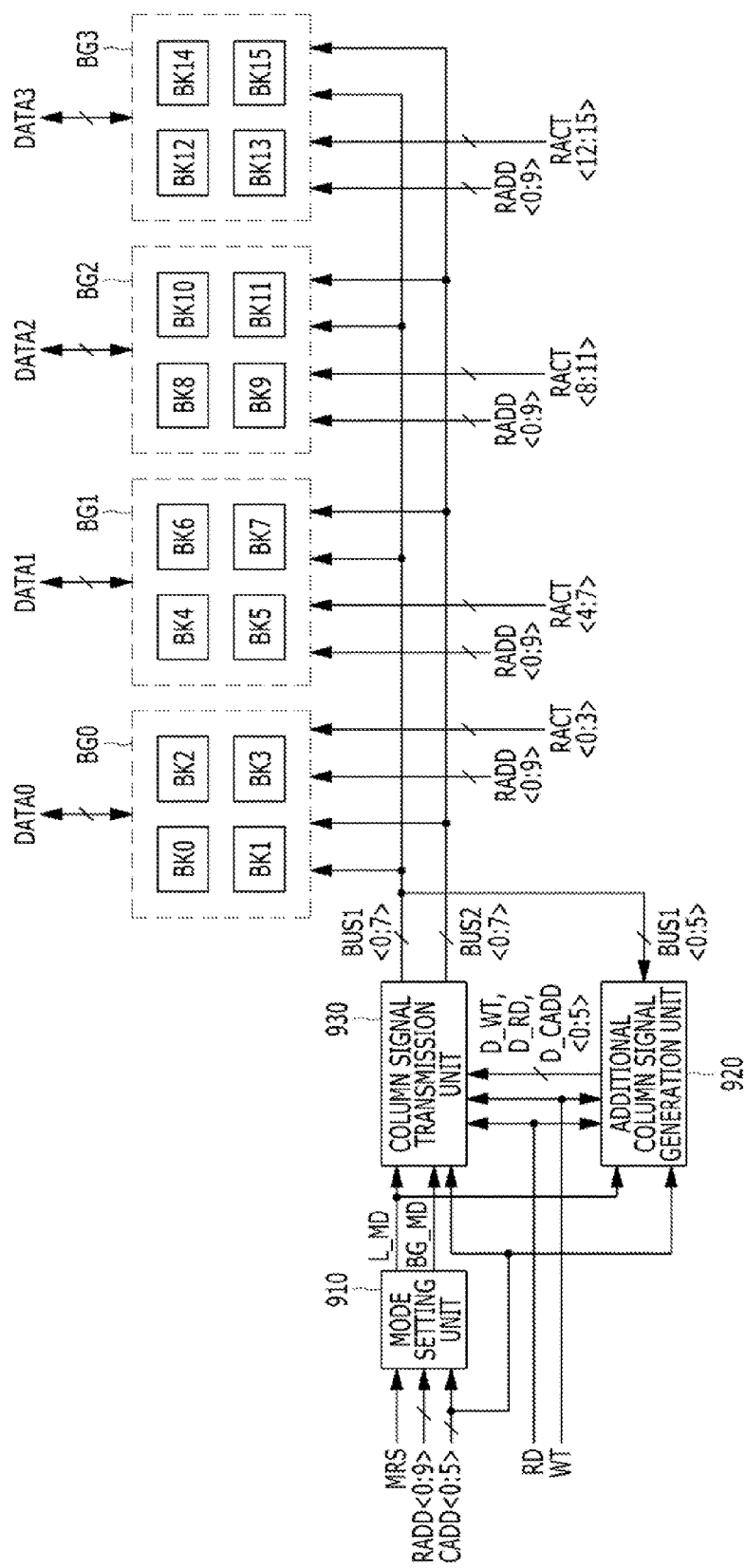
FIG. 9 is a diagram of a memory device in accordance with an embodiment of the present invention.

FIG. 9 is a diagram illustrating a memory device in accordance with an embodiment of the present invention.

Referring to FIG. 9, the memory device may include a mode setting unit 910, an additional column signal generation unit 920, a column signal transmission unit 930, a plurality of bank groups BG0 to BG3, first lines BUS1<0:7>, and second lines BUS2<0:7>. When the memory device of FIG. 9 is set to operate in the short burst mode, two data may be accessed in a selected bank group in response to a single column command, and when the memory device of FIG. 9 is set to operate in the long burst mode, four data may be accessed in a selected bank group in response to a single column command. The bank groups BG0 to BG3 of FIG. 9 may be configured and operated in the same manner as the bank groups BG0 to BG3 of FIG. 2.

The mode setting unit 910 may activate a bank group mode signal BG_MD when the memory device is set to operate in the bank group mode, or deactivate the bank group mode signal BG_MD when the memory device is set not to operate in the bank group mode. The mode setting unit 940 may deactivate a burst mode signal L_MD when the memory device is set to operate in the short burst mode, and activate the burst mode signal L_MD when the memory device is set to operate in the long burst mode.

When the memory device is set to operate in the long burst mode, the additional column signal generation unit 920 may generate an additional read command signal D_RD by delaying a read command signal RD by one clock cycle, generate an additional write command signal D_WT by delaying a write command signal WT by one clock cycle, and generate additional column command signals D_CADD<0:5> by delaying column address signals CADD<0:5> by one clock cycle.

When the memory device is set to operate in the long burst mode, the additional column signal generation unit 960 may invert the column address signal CADD<0> corresponding to the least significant bit of the column address signals CADD<0:5> and generate the additional column address signal D_CADD<0> corresponding to the least significant bit of the additional column address signals D_CADD<0:5>.

When the memory device is set to operate in the short burst mode, the column signal transmission unit 930 may activate a first column command signal RD1/WT1 in case where a column command signal RD/WT corresponding to an odd-numbered column command is activated, and activate a second column command signal RD2/WT2 when a column command signal RD/WT corresponding to an even-numbered column command is activated.

When the memory device is set to operate in the short burst mode, the column signal transmission unit 930 may transmit the column address signals CADD<0:5> to the first lines BUS1<0:5> in case where the first command signal RD1/WT1 is activated, and transmit the column address signals CADD<0:5> to the second lines BUS2<0:5> in case where the second column command signal RD2/WT2 is activated.

When the memory device is set to operate in the long burst mode, the column signal transmission unit 930 may transmit the column address signals CADD<0:5> to the first lines BUS1<0:5> in case where the column command signal RD/WT is activated, and transmit the additional column address signals D_CADD<0:5> to the second lines BUS2<0:5> in case where the additional column command signal D_RD/D_WT is activated.

When the memory device is set to operate in the short burst mode and set not to operate in the bank group mode, the column signal transmission unit 930 may not expand the pulse width of the first or second column command signals RD1 and WT1 or RD2 and WT2. When the memory device is set to operate in the long burst mode and set not to operate in the bank group mode, the column signal transmission unit 930 may not expand the pulse width of the column command signal RD/WT and the additional column command signal D_RD/D_WT.

When the memory device is set to operate in the short burst mode and the bank group mode, the column signal transmission unit 930 may expand the pulse width of the first or second column command signals RD1 and WT1 or RD2 and WT2. Furthermore, when the memory device is set to operate in the long burst mode and the bank group mode, the column signal transmission unit 930 may expand the pulse width of the column command signal RD/WT and the additional column command signal R_RD/D_WT, and further delay the additional column command signal D_RD/D_WT by one clock cycle.

The memory device of FIG. 9 may be operated in the same manner as the memory device of FIG. 2 when set to operate in the short burst mode, and operated in the same manner as the memory device of FIG. 6 when set to operate in the long burst mode.

Figure 10:
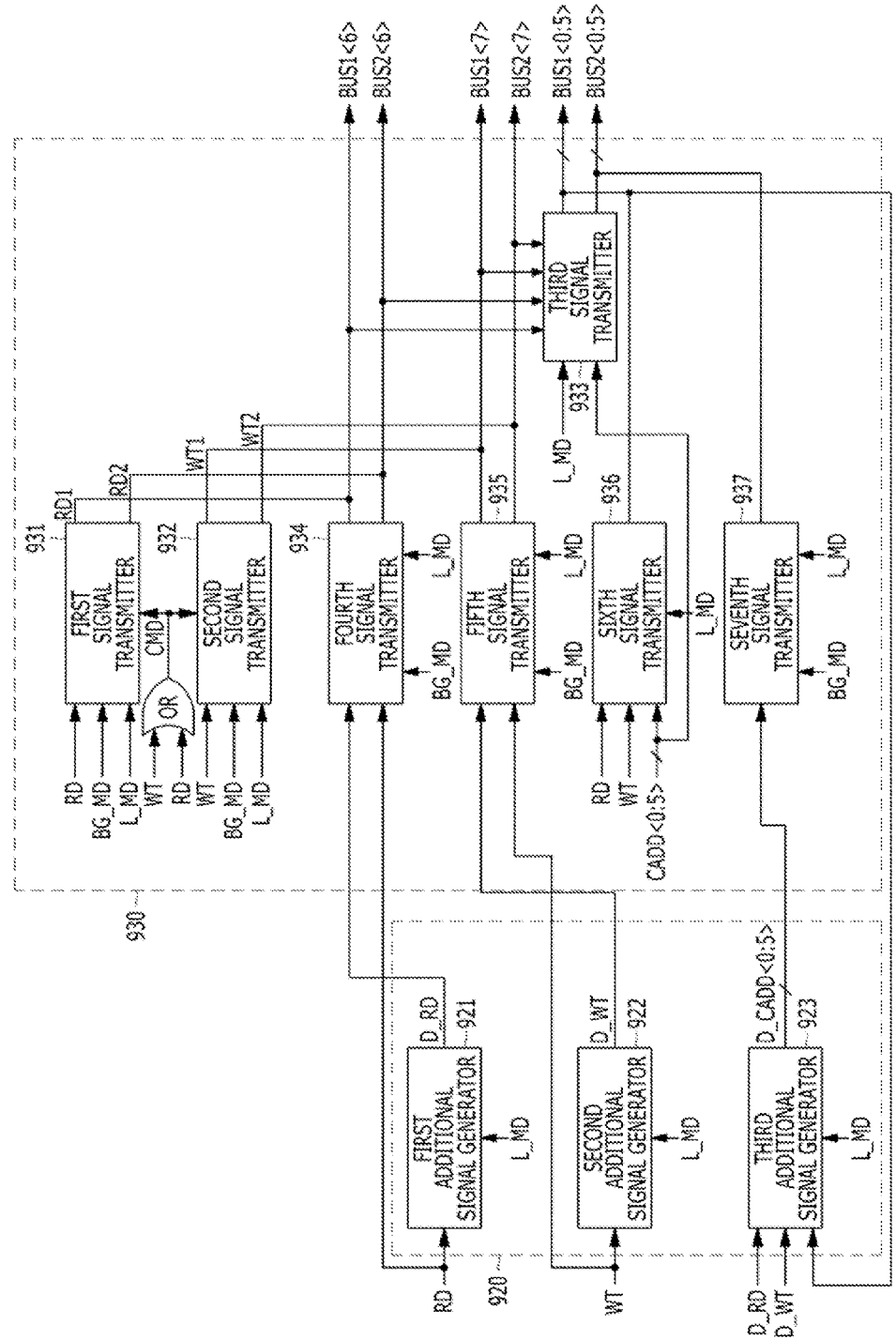
FIG. 10 is a detailed diagram of an additional column signal generation unit and a column signal transmission unit shown in FIG. 9.

FIG. 10 is a detailed diagram of the additional column signal generation unit 920 and the column signal transmission unit 930 shown in FIG. 9.

Referring to FIG. 10, the additional column signal generation unit 920 may include first to third additional signal generators 921 to 923, and the column signal transmission unit 930 may include first to fourth signal transmitters 931 to 937.

The first to third additional signal generators 921 and 923 may be operated in the same manner as the first to third additional signal generators 621 to 623 of FIG. 7, except that the first to third additional signal generators 921 and 923 are operated only when a burst mode signal L_MD is activated.

When the burst mode signal L_MD is deactivated, the first signal transmitter 931 may transmit the read command signal RD as the first read command signal RD1 in case where a read command is an odd-numbered column command, and transmit the read command signal RD as the second read command signal RD2 in case where the read command is an even-numbered column command. The first signal transmitter 931 may not expand the pulse width of the first and second read command signals RD1 and RD2 when the bank group mode signal BG_MD is deactivated, or expand the pulse width of the first and second read command signals RD1 and RD2 when the bank group mode signal BG_MD is activated.

The second signal transmitter 932 may be operated in the same manner as the first signal transmitter 931. That is, the second signal transmitter 932 may transmit the write command signal WT as the first or second write command signal WT1 or WT2.

When the burst mode signal L_MD is deactivated, the third signal transmitter 933 may transmit the column address signals CADD<0:5> to the first lines BUS1<0:5> in case where the first read or write command signal RD1 or WT1 is activated, and transmit the column address signals CADD<0:5> to the second lines BUS2<0:5> in case where the second read or write command signal RD2 and WT2 is activated.

When the burst mode signal L_MD is activated and the bank group mode signal BG_MD is deactivated, the fourth signal transmitter 934 may not delay the additional read command D_RD, but transmit the additional read command D_RD to the second line BUS2<6>. When the burst mode signal L_MD is activated and the bank group mode signal BG_MD is activated, the first signal transmitter 931 may delay the additional read command signal D_RD by one clock cycle and transmit the delayed signal to the second line BUS2<6>. The first signal transmitter 931 may not expand the pulse width of the read command signal RD and the additional read command D_RD when the burst mode signal L_MD is activated and the bank group mode signal BG_MD is deactivated, but expand the pulse width of the read command signal RD and the additional read command D_RD when the burst mode signal L_MD is activated and the bank group mode signal BG_MD is activated.

The fifth signal transmitter 935 may be operated in the same manner as the fourth signal transmitter 934. That is, the fifth signal transmitter 935 may transmit the write command signal WT and the additional write command signal D_WT to the first line BUS1<7> and the second line BUS2<7>, respectively.

When the burst mode signal L_MD signal is activated, the sixth signal transmitter 936 may transmit the column address signals CADD<0:5> to the first lines BUS1<0:5> in case where the read command signal RD or the write command signal WT is activated. The column address signals CADD<0:5> may be transmitted to the third additional signal generator 923 through the first lines BUS1<0:5>.

When the burst mode signal L_MD signal is activated and the bank group mode signal BG_MD is deactivated, the seventh signal transmitter 937 may delay the additional address signals D_CADD<0:5> by one clock cycle, but transmit the delayed signals to the second line BUS2<0:5>. When the burst mode signal L_MD is activated and the bank group mode signal BG_MD is activated, the seventh signal transmitter 937 may delay the additional address signals D_CADD<0:5> by one clock cycle and transmit the delayed signals to the second line BUS2<0:5>.

The memory device of FIG. 9 may support both of the short burst mode and the long burst mode, and the timing margin of the memory device may be doubled like the memory device of FIG. 6. Furthermore, as the number of lines for transmitting CA signals is constantly maintained regardless of the number of bank groups in the memory device, the increase in area of the memory device may be minimized.

The number of column/row address signals and the number of lines for transmitting column/row address signals may differ depending on design. Furthermore, the time point at which a column command signal is generated in response to a column command may differ depending on design.

In accordance with the embodiments of the present invention, the respective bank groups may share the transmission line for command/address signals, thereby minimizing the number lines for transmitting the command/address signals. Furthermore, as command/address signals corresponding to successively inputted commands are separately transmitted, the timing margin of the command/address signals may be sufficiently secured while the area of the memory device is reduced.

Although various embodiments have been described for illustrative purposes, it will be apparent to those skilled in the art that various changes and modifications may be made without departing from the spirit and scope of the invention as defined in the following claims.

What is claimed is:
1. A memory device comprising:
a plurality of bank groups each including a predetermined number of banks;
a plurality of first lines coupled to the plurality of bank groups;
a plurality of second lines coupled to the plurality of bank groups; and a column signal transmission unit suitable for determining whether a column command is an odd-numbered or even-numbered column command, and transmitting one or more column command signals and one or more column address signals to the bank groups through the first lines based on the odd-numbered column command and transmitting the column command signal and the column address signals to the bank groups through the second lines based on the even-numbered column command.

2. The memory device of claim 1, wherein the column command signals correspond to a read command for outputting data stored in the bank group and a write command for storing data in the bank group.

3. The memory device of claim 2, wherein the column signal transmission unit comprises:
a first signal transmitter suitable for transmitting the read command signal as a first read command signal when the read command is the odd-numbered column command, and transmitting the read command signal as a second read command signal when the read command is the even-numbered column command, the read command signal being activated when the read command is inputted;
a second signal transmitter suitable for transmitting the write command signal as a first write command signal when the write command is the odd-numbered column command, and transmitting the write command signal as a second write command signal when the write command is the even-numbered column command, the write command signal being activated when the write command is inputted; and
a third signal transmitter suitable for transmitting the column address signals to the first lines when the first read command signal or the first write command signal is activated, and transmitting the column address signals to the second lines when the second read command signal or the second write command signal is activated.

4. The memory device of claim 3, wherein the first signal transmitter expands the pulse width of the first and second read command signals when the memory device is set to operate in a bank group mode, and maintains the pulse width of the first and second read command signals when the memory device is set not to operate in the bank group mode.

5. The memory device of claim 4, wherein the second signal transmitter expands the pulse width of the first and second write command signals when the memory device is set to operate in the bank group mode, and maintains the pulse width of the first and second write command signals when the memory device is set not to operate in the bank group mode.

6. The memory device of claim 5, wherein, in the bank group mode, one bank group of the bank groups is not successively accessed, but the bank groups are alternately accessed.

7. A memory device comprising:
a plurality of bank groups each including a predetermined number of banks;
a plurality of first lines coupled to the plurality of bank groups;
a plurality of second lines coupled to the plurality of bank groups;
an additional column signal generation unit suitable for generating one or more additional column command signals by delaying one or more column command signals corresponding to a column command, and generating one or more additional column address signals by delaying one or more column address signals; and
a column signal transmission unit suitable for transmitting the column command signals and the column address signals to the bank groups through the first lines and transmitting the additional column command signals and the additional column address signals to the bank groups through the second lines.

8. The memory device of claim 7, wherein the additional column signal generation unit inverts a column address signal corresponding to the least significant bit of the column address signals, and generates an additional column address signal corresponding to the least significant bit of the additional column address signals.

9. The memory device of claim 7, wherein the column command signals correspond to a read command for outputting data stored in the bank group and a write command for storing data in the bank group.

10. The memory device of claim 9, wherein the additional column signal generation unit generates an additional read command signal by delaying the read command signal by one clock cycle, generates an additional write command signal by delaying the write command signal by one clock cycle, and generate the additional column command signals by delaying the column address signals by one clock cycle, and
the read command signal is activated when the read command is inputted, and the write command signal is activated when the write command is inputted.

11. The memory device of claim 10, wherein the column signal transmission unit transmits the column address signals to the first lines when the read command signal or the write command signal is activated, and transmits the additional address signals to the second lines when the additional read command signal or the additional write command signal is activated.

12. The memory device of claim 11, wherein, when the memory device is set to operate in a bank group mode, the column signal transmission unit delays the additional read or write command signal by one clock cycle, transmits the delayed signal to the second line, delays the additional column address signals by one clock cycle, and transmits the delayed signals to the second lines, and
when the memory device is set not to operate in the bank group mode, the column signal transmission unit transmits the additional read or write command signal to the second line without delaying, and transmits the additional column address signals to the second lines without delaying.

13. The memory device of claim 12, wherein the column signal transmission unit expands the pulse width of the read and write command signals and the additional read and write command signals when the memory device is set not to operate in the bank group mode, and maintains the pulse width of the read and write command signals and the additional read and write command signals when the memory device is set not to operate in the bank group mode.

14. The memory device of claim 13, wherein, in the bank group mode, one bank group of the bank groups is not successively accessed, but the bank groups are alternately accessed.

15. A memory device comprising:
a plurality of first lines coupled to the plurality of bank groups;
a plurality of second lines coupled to the plurality of bank groups;

a plurality of bank groups each including a predetermined number of banks;

an additional column signal generation unit suitable for generating one or more additional column command signals by delaying one or more column command signals corresponding to a column command, and generating one or more additional column address signals by delaying one or more column address signals, when the memory device is set to operate in a long burst mode; and a column signal transmission unit suitable for determining whether a column command is an odd-numbered or even-numbered column command, and transmitting the column command signals and the column address signals to the bank groups through the first lines based on the odd-numbered column command and transmitting the column command signals and the column address signals to the bank groups through the second lines based on the even-numbered column command, when the memory device is set to operate in a short burst mode, and transmitting the column command signals and the column address signals to the bank groups through the first lines and transmitting the additional column command signals and the additional column address signals to the bank groups through the second lines, when the memory device is set to operate in the long burst mode.

16. The memory device of claim 15, wherein the additional column signal generation unit inverts a column address signal corresponding to the least significant bit of the column address signals, and generates an additional column address signal corresponding to the least significant bit of the additional column address signals.

17. The memory device of claim 15, wherein, in the short burst mode, N data are accessed at a time in one bank group of the bank groups, and in the long burst mode 2N data are accessed at a time in one bank group of the bank groups, where N is a natural number equal to more than 2.

18. The memory device of claim 15, wherein, when the memory device is set to operate in a bank group mode, the column signal transmission unit delays the additional command signal and the additional column address signals and transmits the delayed signals to the second lines, and when the memory device is set not to operate in the bank group mode, the column signal transmission unit transmits the additional command signal and the additional column address signals to the second lines without delaying.

19. The memory device of claim 18, wherein the column signal transmission unit expands the pulse width of the column command signal and the additional column command signal when the memory device is set to operate in the bank group mode, and maintains the pulse width of the column command signal and the additional column command signal when the memory device is set not to operate in the bank group mode.

20. The memory device of claim 19, wherein, in the bank group mode, one bank group of the bank groups is not successively accessed, but the bank groups are alternately accessed.

* * * * *